US005124603A

United States Patent [19]

Hayward et al.

[11] Patent Number: 5,124,603

[45] Date of Patent: Jun. 23, 1992

[54] ROTATING RECTIFIER ASSEMBLY

[75] Inventors: Dennis R. Hayward, Pitstone; John Cooper, Hemel Hempstead; Raymond R. Bomford, Chalfont St. Peter; Terence L. Crickmore, Hemel Hempstead, all of United Kingdom

[73] Assignee: Lucas Industries plc, United Kingdom

[21] Appl. No.: 639,973

[22] Filed: Jan. 11, 1991

[30] Foreign Application Priority Data

Jan. 13, 1990 [GB] United Kingdom ................. 9000787

[51] Int. Cl.[5] ............................................. H02K 11/00

[52] U.S. Cl. .................................... 310/68 D; 310/71

[58] Field of Search .................... 310/68 D, 68 R, 71; 363/126, 144; 357/76, 75

[56] References Cited

U.S. PATENT DOCUMENTS

| | | | |
|---|---|---|---|
| 2,722,652 | 11/1955 | Brainard | 310/68 D |
| 4,052,631 | 10/1977 | Kuter | 310/68 D |
| 4,329,603 | 5/1982 | Ballard | 310/68 D |
| 4,367,523 | 1/1983 | Urba | 363/144 |
| 4,583,005 | 4/1986 | Bevans | 310/68 D |
| 4,603,344 | 7/1986 | Trommer | 310/68 D |
| 4,628,219 | 12/1986 | Troscinski | 310/68 D |
| 4,896,062 | 1/1990 | Pollard | 310/68 D |
| 4,959,572 | 9/1990 | Becker | 310/68 D |
| 4,959,707 | 9/1990 | Pinchott | 357/76 |

FOREIGN PATENT DOCUMENTS

| | | | |
|---|---|---|---|
| 0168491 | 8/1989 | European Pat. Off. . | |
| 1538985 | 3/1970 | Fed. Rep. of Germany | 310/68 D |
| 1817078 | 7/1972 | Fed. Rep. of Germany . | |
| 0061730 | 5/1977 | Japan | 310/68 D |
| 0031354 | 3/1981 | Japan | 310/68 D |
| 925623 | 5/1963 | United Kingdom . | |

*Primary Examiner*—Steven L. Stephan
*Assistant Examiner*—C. LaBalle
*Attorney, Agent, or Firm*—Jones, Askew & Lunsford

[57] ABSTRACT

A rotatable rectifier assembly has four rectifiers each comprising a group of bead type diodes mounted between axially spaced electrical conductors, the conductors being pre-loaded together to enable the diode connections to better withstand centrifugal forces. The assembly includes a spacing material to take up manufacturing tolerances and thereby ensure that each of the diode groups takes a substantially equal proportion of the applied pre-load.

16 Claims, 3 Drawing Sheets

FIG.1.
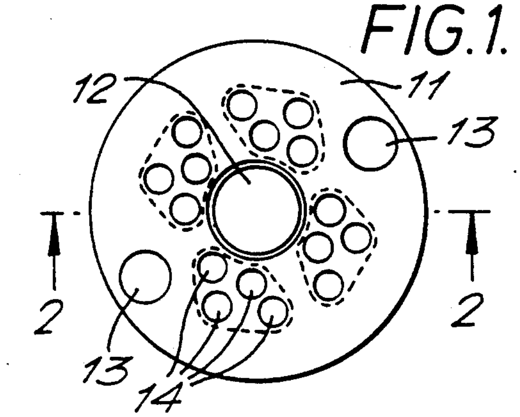
FIG.3.
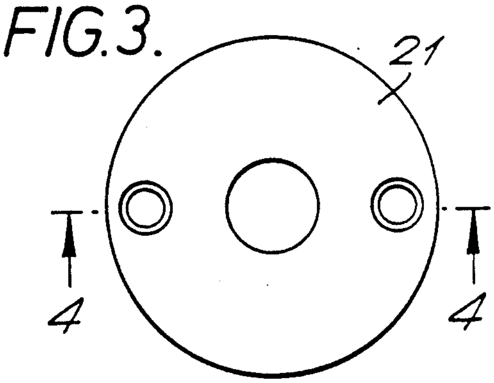
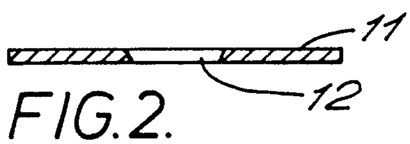
FIG.2.
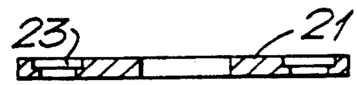
FIG.4.
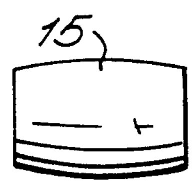
FIG.5.
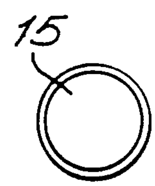
FIG.6.
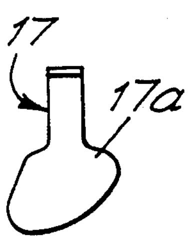
FIG.7.
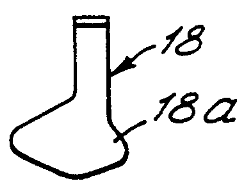
FIG.8.
FIG.9.
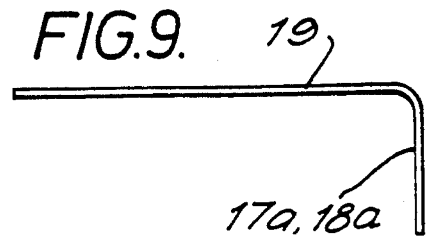

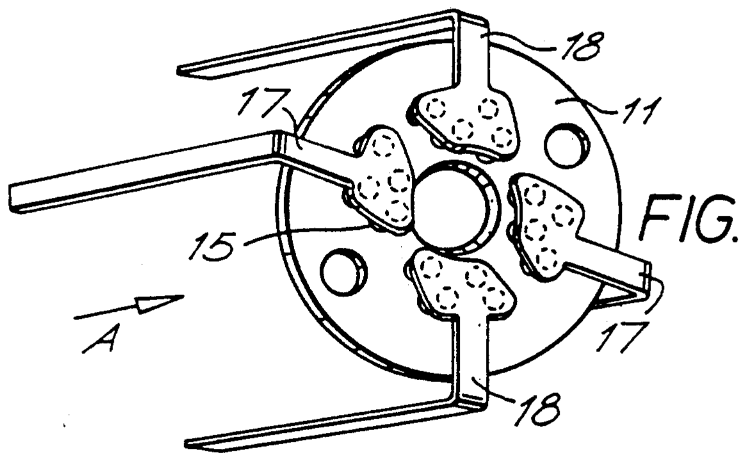
FIG. 10.
FIG. 11.
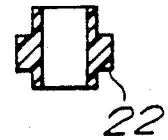
FIG. 12.
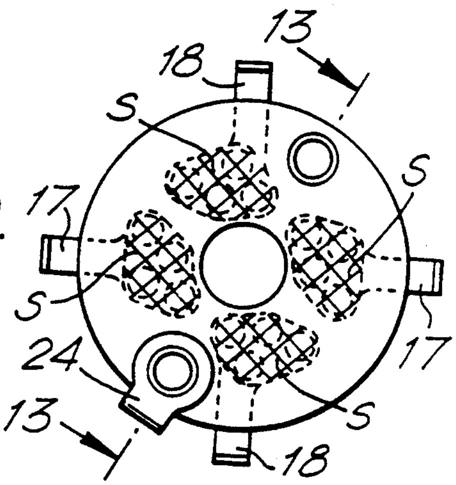
FIG. 13.
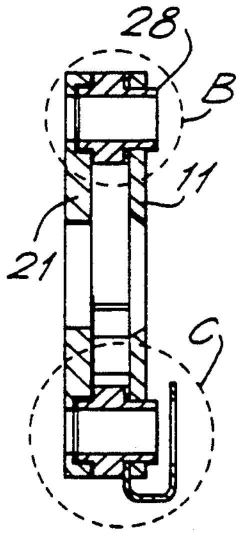
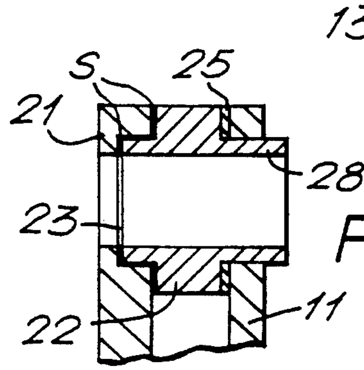
FIG. 14.
FIG. 15.
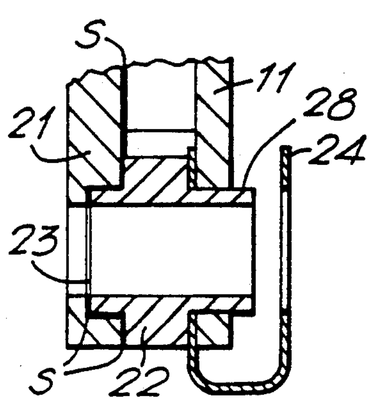
FIG. 16.
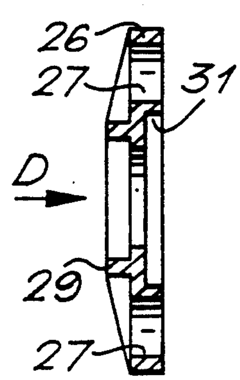
FIG. 17.
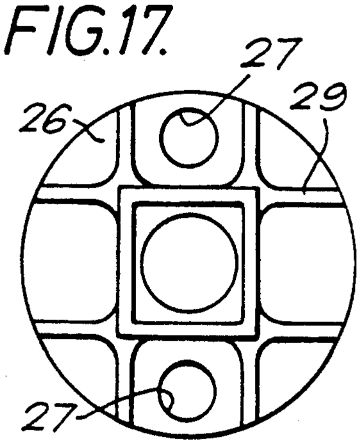

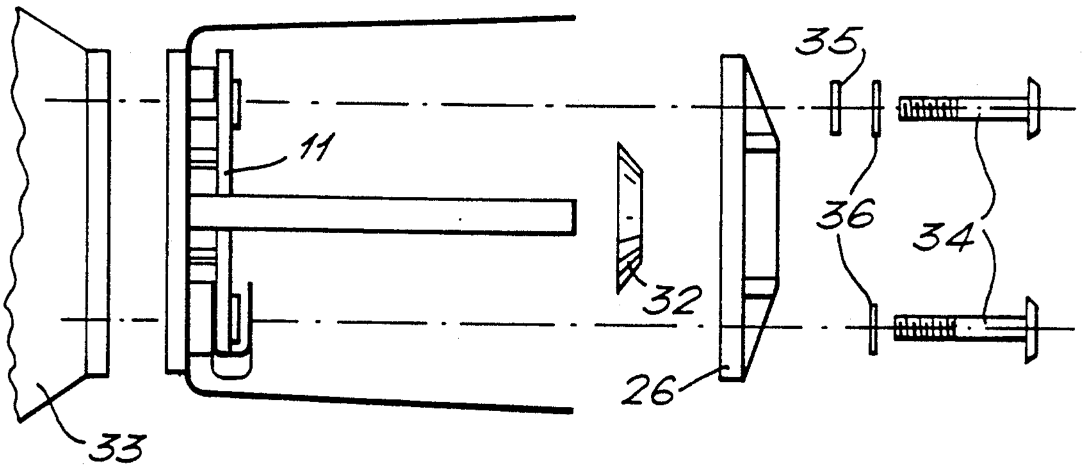
FIG.18.
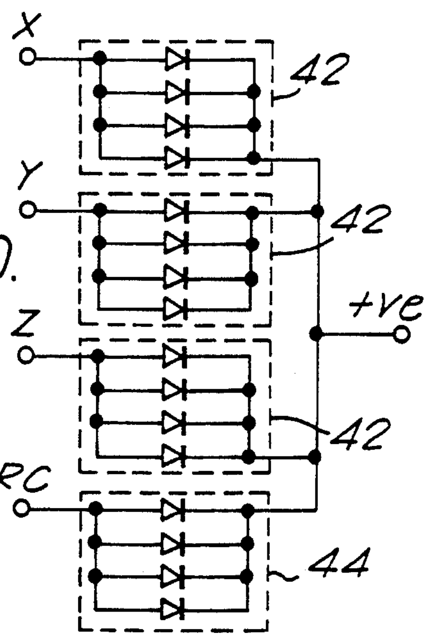
FIG.20.
FIG.19.
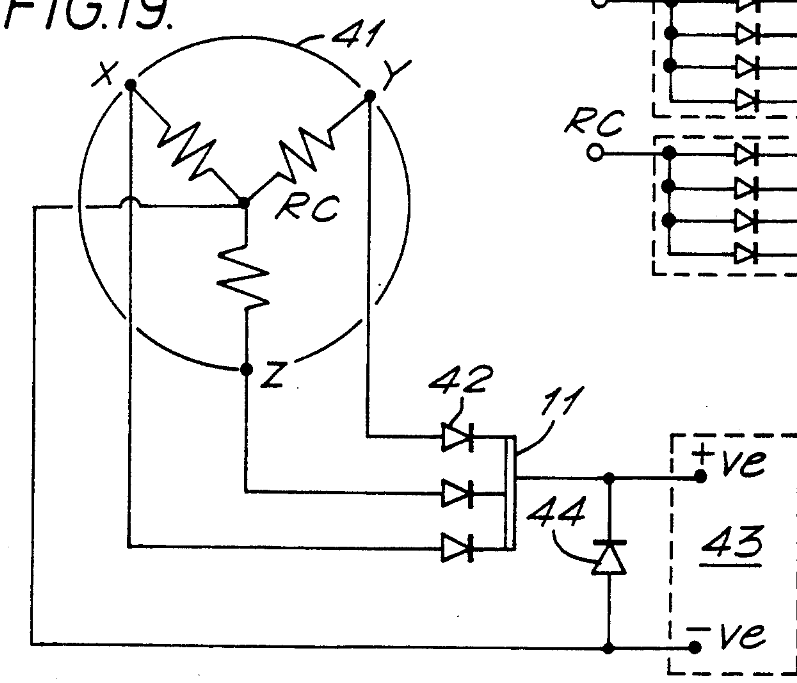

ROTATING RECTIFIER ASSEMBLY

This invention relates to rotating rectifier assemblies such as those used in alternators for aircraft auxiliary power units.

Rotating rectifier assemblies and the problems associated therewith are well known; such assemblies must be compact, robust and of sufficient strength to withstand the forces imparted by rotation at up to 25,000 r.p.m.

In one known arrangement rectification is provided between each phase of a three phase star wound generator winding and a common d.c. output (+ve); the star Point of the generator winding provides the other d.c. output (−ve).

It has been found advantageous to also provide rectification between the star point and the common (+ve) d.c. output. In normal circumstances no current flows through the fourth rectifier; however in the event that the electrical supply from one or more of the phases is lost, the induced voltage is allowed to dissipate by recirculating current through the windings via the fourth rectifier.

Thus a rotating rectifier assembly according to this arrangement has four rectifiers.

Typically each rectifier comprises one or more diodes soldered to electrical conductors. In order to better withstand centrifugal forces it has been proposed to individually pre-load the electrical joints by means of springs. However, since the electrical resistance of each joint may depend on the pre-load applied, it has been found necessary to adopt means for equalising the pre-loads of each rectifier to ensure that the rectified output of each phase is substantially the same.

In one prior art rotating rectifier, three pairs of diodes are arranged between substantially circular conductors rotating together about a common axis. The pairs of diodes are 120° apart and have a pre-load applied by a single belleville washer; this arrangement ensures that the pre-load is shared equally by the equispaced diodes.

Difficulties arise with four rectifiers disposed in the same way since it is possible for three of the rectifiers to support a substantial proportion of the pre-load whilst the fourth carries little or no load.

According to the invention there is provided a rotatable rectifier comprising an electrically conductive baseplate rotatable about an axis and having a surface orthogonal to said axis, a plurality of substantially similar diodes extending axially from said surface and having an electrical connection thereto, each diode having one of a plurality of radially outwardly extending conductors at the free end thereof such that an electrical path from said conductors to said baseplate passes through said diodes, and the axially outer faces of the conductors being substantially co-planar; an insulating member covering said outer faces and having an axially outer face parallel to said surface, the diodes being capable of supporting an axial load between said baseplate and insulating member; and a spacing material between said faces and said insulating member for accommodating manufacturing tolerances. The spacing material ensures that the diodes share a pre-load equally as will be further described.

Preferably the diodes are of the silicon junction non-cavity bead type.

The baseplate forms a common electrical conductor for the diode output whilst electrical input is through the conductors. Each diode may in fact comprise a group of diodes between a common conductor and the baseplate thus enabling the number of individual diodes to be varied according to the power requirement of the rectifier.

In the preferred embodiment four groups of four bead type diodes are mounted around the baseplate.

In a preferred embodiment the rectifier further includes two or more spacers between said baseplate and insulating member, said spacers being fixed relative to one of the baseplate and insulating member and being located in the other with a clearance; a spacing material within said clearance holding each spacer relative to the other of said baseplate and insulating member. The spacers are preferably cylindrical, one end of each being force fitted in a corresponding bore of the baseplate and the other end of each being located in a corresponding bore of the insulating member. These spacers hold the baseplate and insulating member in circumferential alignment.

The baseplate and insulating member may be discs of substantially the same diameter, and each of a substantially constant thickness and having a respective aperture at the centre thereof.

In a preferred embodiment the spacing material comprises a cured compliant coating which allows for variation in manufacturing tolerances, as will be further described, so that when the assembly is clamped into a generator, each diode group supports an approximately equal proportion of the clamping load. The coating may also be an adhesive, and a suitable material is PERMABOND ESP 110 manufactured by permabond Adhesives Limited of Eastleigh, Hampshire, England.

The assembly may further include an abutment for the axially outer face of said insulating member, a disc spring in abutment with the axially outer face of said baseplate, a clamping plate for said disc spring and means to draw the clamping plate and abutment together so as to compress said spring in use and thereby place the diodes under axial compression.

Such an arrangement allows the clamping load from the spring to be evenly distributed to each diode or group of diodes.

The rectifier assembly is relatively easy to construct, has a low mass and a low volume. The spring load is wholly axial thus eliminating any tendency for a radial component of spring force to urge the diodes outward as is the case with some prior art arrangements. In use the assembly is reliable and robust.

Preferably the disc spring comprises a belleville washer and the abutment comprises a rotatable component of a generator. The spring may be compressed by screws extending from the clamping plate to the abutment.

In a preferred embodiment two screws are provided, each extending through said clamping plate, baseplate and insulating member into tapped holes of the abutment.

Preferably said screws pass through the cylindrical spacers above-mentioned.

In the preferred embodiment an aperture extends through the centre of the clamping plate, baseplate and insulating member along the axis of rotation, a transfer tube for generator coolant extending through the aperture in use.

The invention also provides a method of assembly of a rotating rectifier and comprising the steps of:

soldering a plurality of substantially similar bead type diodes to one side of an electrically conducting baseplate;

soldering a plurality of conductors to the free ends of said diodes such that an electrical path from said conductors to said baseplate passes through said diodes, and said conductors are substantially co-planar;

applying a curable compliant coating to the outer faces of said conductors;

placing an insulating member against said coating: holding said baseplate and insulating member in a jig in a predetermined configuration; and curing said coating to permanently hold the baseplate and insulating member in said predetermined configuration.

Preferably the method includes the intermediate steps of:

attaching a plurality of spacers on said one side of said baseplate;

applying a curable compliant coating to the free ends of said spacers; and locating the free ends of said spacers with respect to said insulating member as the insulating member is placed against the coating on said conductors.

Other aspects of the invention will be apparent from the following description of a preferred embodiment shown by way of example only in the accompanying drawings in which:

FIG. 1 shows a baseplate in plan;

FIG. 2 is an axial section through the baseplate of FIG. 1 on line 2—2;

FIG. 3 shows an insulating spacer in plan;

FIG. 4 is an axial section through the spacer of FIG. 3 on line 4—4;

FIG. 5 is an enlarged elevation of a bead type rectifier;

FIG. 6 is an end elevation of the rectifier of FIG. 5;

FIG. 7 is an end elevation of an electrical connector;

FIG. 8 is an end elevation of an alternative electrical connector;

FIG. 9 is a side elevation of the connector of FIGS. 7 and 8;

FIG. 10 is a schematic isometric view of a partially constructed rectifier assembly;

FIG. 11 is an axial section through a circular bush;

FIG. 12 is an elevation of the rectifier assembly, in the direction of arrow 'A' of FIG. 10;

FIG. 13 is an axial section through the assembly of FIG. 12 on line 13—13;

FIG. 14 is an enlarged scrap section corresponding to 'B' of FIG. 13;

FIG. 15 is an enlarged scrap section corresponding to 'C' of FIG. 13;

FIG. 16 is an axial section through a clamping plate;

FIG. 17 is an elevation of the plate of FIG. 16 in the direction of arrow D;

FIG. 18 is an exploded view of a rectifier assembly for installation in a generator;

FIG. 19 is a schematic illustration of an electrical circuit for the invention;

FIG. 20 is a schematic illustration of a diode arrangement for the invention.

The rectifier assembly comprises a baseplate 11, of silver plated copper, having a central aperture 12, and a pair of diametrically opposite mounting holes 13; the aperture 12 is tapered as shown in FIG. 13.

The baseplate 11 has on one side sixteen spotfaced recesses 14 arranged in groups of four as indicated.

Each recess 14 is of a diameter and depth suitable for locating a silicon junction, non-cavity bead type rectifier 15; four such rectifiers are provided in each group to permit a high current rating.

Connectors 17, 18 of silver plated beryllium copper provide an electrical connection from the free ends of each group of rectifiers as shown. Each connector comprises an end plate 17*a*, 18*a* and a free limb 19 extending around the baseplate and axially away therefrom.

The baseplate, rectifiers and connectors are assembled in a jig with solder pre-forms for the ends of the stud rectifiers; the jig ensures that the end plates 17*a*, 18*a* are substantially co-planar, and that the outerface of each end plate is substantially parallel to the outerface of the baseplate. The assembly is heated to melt the solder, as will be further described, and the solder is allowed to cool giving a good mechanical and electrical connection at each end of each rectifier.

A circular insulating spacer 21 of polyetherimide resin covers the cuter faces of the end plates as shown. The spacer 21 is supported by two shouldered hollow bushes 22, of polyphenylene sulfide, each located at one end in the mounting holes 13 and at the other end in a corresponding stepped hole 23 of the spacer 21.

The bushes are an interference fit in the baseplate but have clearance in the holes 23 as indicated in FIGS. 14 and 15. During assembly of the spacer adhesive S is applied to the outer faces of the end plates 17*a*, 18*a* and to the free ends of the bushes as illustrated in FIGS. 12–15; the adhesive takes up the clearance and, on curing, holds the spacer securely in place as will be further described.

A tag connector 24 is provided under one of the bushes to provide an electrical path from the baseplate, and a corresponding washer 25 is provided under the other bush as shown in FIGS. 14 and 15.

An annular clamping plate 26, of aluminum alloy, includes apertures 27 to accommodate the protruding ends 28 of the bushes 22. The plate 26 has stiffening ribs 29 on one side and a recess 31 on the opposite side to accommodate a disc spring or belleville washer 32. On assembly, the disc spring provides a preload on the rectifiers as will be described below.

The method of assembly is as follows. The baseplate 11 is held horizontal whilst the rectifiers 15 and connectors 17, 18 are assembled thereto in a jig.

On completion of the soldering step, the tag 24 and washer 25 are positioned and the bushes 22 assembled into the baseplate 11; the spacer 21 is placed over the free ends of the bushes after adhesive has been applied to the contact faces of the bushes and connectors. A jig is used to ensure that the outer surfaces of baseplate and spacer are held parallel whilst the adhesive cures; variation in adhesive thickness accommodating manufacturing tolerances.

The rectifier assembly 30 is connected to a carrier as shown in FIG. 18. The carrier 33 has locking screw-threaded inserts (not shown) to correspond with apertures 13. The clamping plate 26 is placed over the spring 32 and bolts 34 are passed through the aligned apertures 13, 23, 27 to clamp the rectifier assembly 30 to the carrier 33. A washer 35 corresponds to tag 24, and washers 36 lie immediately under the heads of the bolts 34.

In use a coolant transfer tube (not shown) passes through the central aperture of the assembly 30. Drive means, not shown, rotate the entire assembly. Electrical connection from the windings of the exciter rotor is through the connector arms 19. Electrical connection to the main generator windings is through the tag 24, and a second tag (not shown) which also lies under the head of bolt 34.

The material of the spacer 21 has a co-efficient of expansion close to that of the baseplate 11, and the bushes 22 have a co-efficient of expansion close to that of the bolts 34; this arrangement minimises internal stresses resulting from the high temperature at which the assembly may operate.

A schematic electrical circuit is shown in FIG. 19. The exciter 41 is star wound and the output terminals are labelled X,Y,Z; each terminal (one for each phase) is connected through a diode 42 to the baseplate 11 which provides the +ve output to the main generator 43.

The star point, labelled RC, is connected through a fourth diode 44 to the baseplate output, or the baseplate 11 itself; current only flows through the fourth diode when the output from terminals X,Y and Z is interrupted.

The particular diode arrangement of the preferred embodiment is illustrated in FIG. 20, four individual rectifiers being provided in parallel for each diode group.

We claim:

1. A rotatable rectifier comprising an electrically conductive baseplate rotatable about an axis and having a surface orthogonal to said axis, a plurality of substantially similar diodes extending axially from said surface and having an electrical connection thereto, each diode having one of a plurality of conductors at the free end thereof such that an electrical path from said conductors to said baseplate passes through said diodes, said conductors extending radially outwardly from the diodes and beyond the outer periphery of said baseplate and the axially outer faces of the conductors being substantially co-planar; an insulating member covering said outer faces and having an axially outer face parallel to said surface, the diodes being capable of supporting an axial load between said baseplate and insulating member; and a spacing material between said axially outer faces of the conductors and the axially inner face of said insulating ember, said insulating member for accommodating manufacturing tolerances.

2. A rectifier according to claim 1 and further including two or more spacers between said baseplate and insulating member, said spacers being fixed relative to one of the baseplate and insulating member and being located in the other with a clearance; a spacing material within said clearance holding each spacer relative to the other of said baseplate and insulating member.

3. A rectifier according to claim 2, wherein said spacers are cylindrical, one end of each being force fitted in a corresponding bore of the baseplate and the other end of each being located in a corresponding bore of the insulating member.

4. A rectifier according to claim 3 and further including clamping means passing through said spacers, said clamping means comprising threaded rods.

5. A rectifier according to claim 1 wherein said baseplate and insulating member are discs of substantially the same diameter, and each of a substantially constant thickness and having a respective aperture in the centre thereof.

6. A rectifier according to claim 1 and further including an abutment for the axially outer face of said insulating member, resilient means in abutment with the axially outer face of said baseplate, a clamping plate in abutment with the axially outer face of said resilient means, and clamping means to draw said clamping plate and abutment together thereby to place said diodes under axial load.

7. A rectifier according to claim 6 wherein said resilient means comprises a single disc spring.

8. A rectifier according to claim 6 wherein said abutment comprises a rotatable component of an electrical generator.

9. A rectifier according to claim 1 wherein said spacing material comprises a cured compliant coating.

10. A rectifier according to claim o wherein said coating comprises an adhesive.

11. A rectifier according to claim 1 and including four groups of four bead type diodes, each group of diodes being connected to a respective conductor.

12. A rotatable rectifier comprising:

an electrically conductive baseplate rotatable about an axis and having a surface orthogonal to said axis, a plurality of substantially similar diodes extending axially from said surface and having an electrical connection thereto, each diode having one of a plurality of radially outwardly extending conductors at the free end thereof such that an electrical path from said conductors to said baseplate passes through said diodes, and the axially outer faces of the conductors being substantially co-planar;

an insulating member covering said outer faces and having an axially outer face parallel to said surface, the diodes being capable of supporting an axial load between said baseplate and insulating member;

a spacing material between said faces and said insulating member for accommodating manufacturing tolerances;

at least two spacers between said baseplate and insulating member, said spacers being fixed relative to one of the baseplate and insulating member and being located in the other with a clearance; and the spacing material being within said clearance and holding each spacer relative to the other of said baseplate and insulating member.

13. A rotatable rectifier comprising:

an electrically conductive baseplate rotatable about an axis and having a surface orthogonal to said axis, a plurality of substantially similar diodes extending axially from said surface and having an electrical connection thereto, each diode having one of a plurality of radially outwardly extending conductors at the free end thereof such that an electrical path from said conductors to said baseplate passes through said diodes, and the axially outer faces of the conductors being substantially co-planar;

an insulating member covering said outer faces and having an axially outer face parallel to said surface, the diodes being capable of supporting an axial load between said baseplate and insulating member;

a spacing material between said faces and said insulating member for accommodating manufacturing tolerances;

an abutment for the axially outer face of said insulating member, resilient means in abutment with the axially outer face of said baseplate;

a clamping plate in abutment with the axially outer face of said resilient means; and clamping means to draw said clamping plate and abutment together thereby to place said diodes under axial load.

14. A rectifier according to claim 13 wherein said resilient means comprises a single disc spring.

15. A rectifier according to claim 13 wherein said abutment comprises a rotatable component of an electrical generator.

16. A rotatable rectifier comprising:

an electrically conductive baseplate rotatable about an axis and having a surface orthogonal to said axis, a plurality of substantially similar diodes extending axially from said surface and having an electrical thereto, each diode having one of a plurality of radially outwardly extending conductors at the free end thereof such that an electrical path from said conductors to said baseplate passes through said diodes, and the axially outer faces of the conductors being substantially co-planar;

an insulating member covering said outer faces and having an axially outer face parallel to said surface, the diodes being capable of supporting an axial load between said baseplate and insulating member;

a spacing material between said faces and said insulating member for accommodating manufacturing tolerances; and said diodes including four groups of four bead type diodes, each group of diodes being connected to a respective conductor.

* * * * *